United States Patent [19]

Whitehead et al.

[11] Patent Number: 4,682,270
[45] Date of Patent: Jul. 21, 1987

[54] INTEGRATED CIRCUIT CHIP CARRIER

[75] Inventors: Graham K. Whitehead, Ipswich; Kenneth Taylor, East Barnet, both of England

[73] Assignee: British Telecommunications public limited company, United Kingdom

[21] Appl. No.: 734,650

[22] Filed: May 16, 1985

[30] Foreign Application Priority Data

May 18, 1984 [GB] United Kingdom ............... 8412674

[51] Int. Cl.4 ............................................. H05K 1/18
[52] U.S. Cl. ............................... 361/401; 174/52 FP; 357/80; 361/400
[58] Field of Search ................. 357/74, 80; 361/392, 361/395, 399–401, 408, 413; 174/525 FP

[56] References Cited

U.S. PATENT DOCUMENTS 3,471,753 10/1969 Burks et al. .
4,288,841 9/1981 Gogal ............................ 361/395 X
4,451,845 5/1984 Philofsky ......................... 357/80 X
4,463,217 7/1984 Orcutt .............................. 174/52 FP
4,554,404 11/1988 Gilder, Jr. et al. ............. 174/52 FP

FOREIGN PATENT DOCUMENTS 0055578 7/1982 European Pat. Off. .
0074817 10/1982 European Pat. Off. .
255667 4/1964 Netherlands ................. 317/101 CP
2109629 3/1981 United Kingdom .
2115607 2/1983 United Kingdom .

OTHER PUBLICATIONS

ICI Publication 'Victrex' Polyethersulphone.
Electronics Dec. 15, 1982, pp. 155–158.
Welwyn Electric Ltd. Newsletter, Feb. 83.

Primary Examiner—Arthur T. Grimley
Assistant Examiner—Jane K. Lau
Attorney, Agent, or Firm—Nixon & Vanderhye

[57] ABSTRACT

A chip carrier includes a body (1) having a central region and sidewalls (31) connected to the central region by an elastically deformable region (33), in order to reduce thermal strains.

Also for the same reason a heat sink (41) may be attached underneath the carrier below the carrier's die attachment site (8) and thermally conductive material (40,42) may connect them together. The heat sink may be used for mechanical anchorage.

The chip carrier may be produced by injection moulding from an aromatic thermoplastic polymer.

A carrier may be moulded with more than one die attachment site or a circuit board with die attachment sites could be moulded, preferably with the die attachment site recessed so that the surface of the die 9 is co-planar with conductive tracks on the board.

31 Claims, 13 Drawing Figures

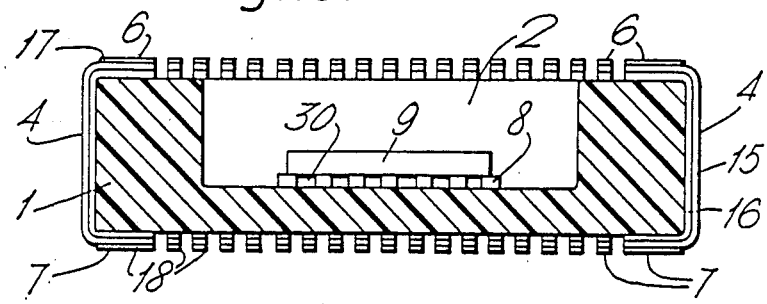
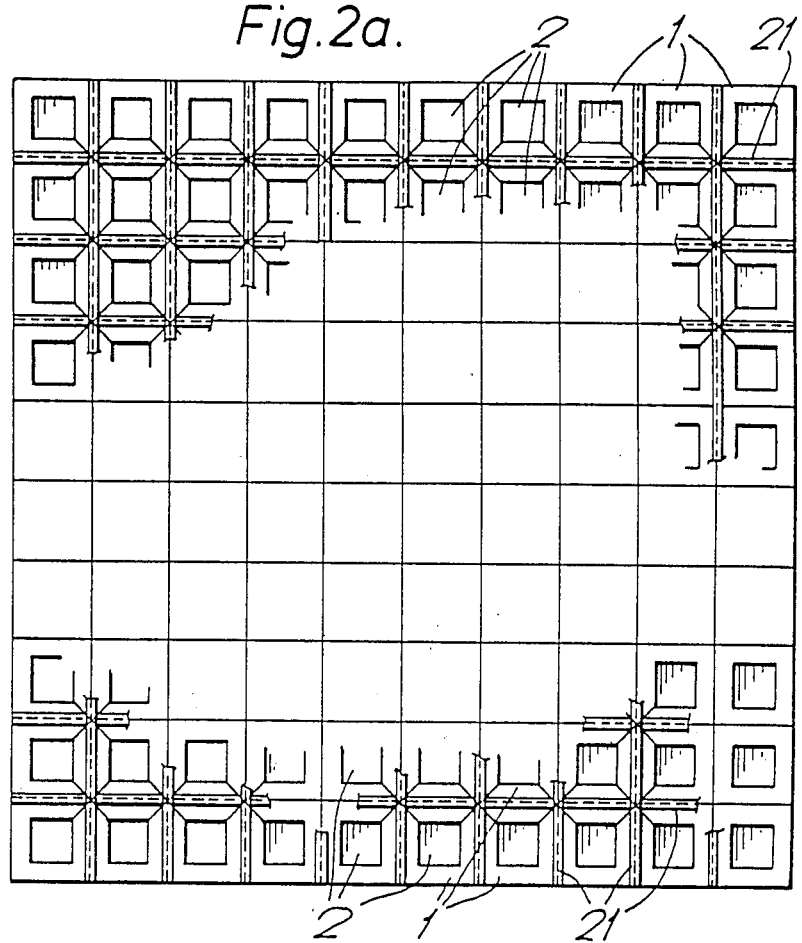

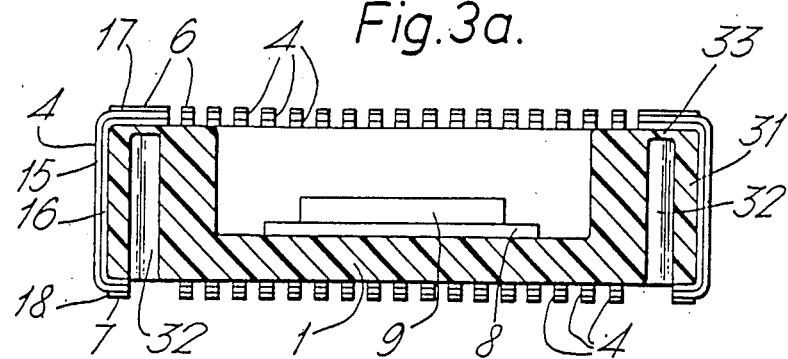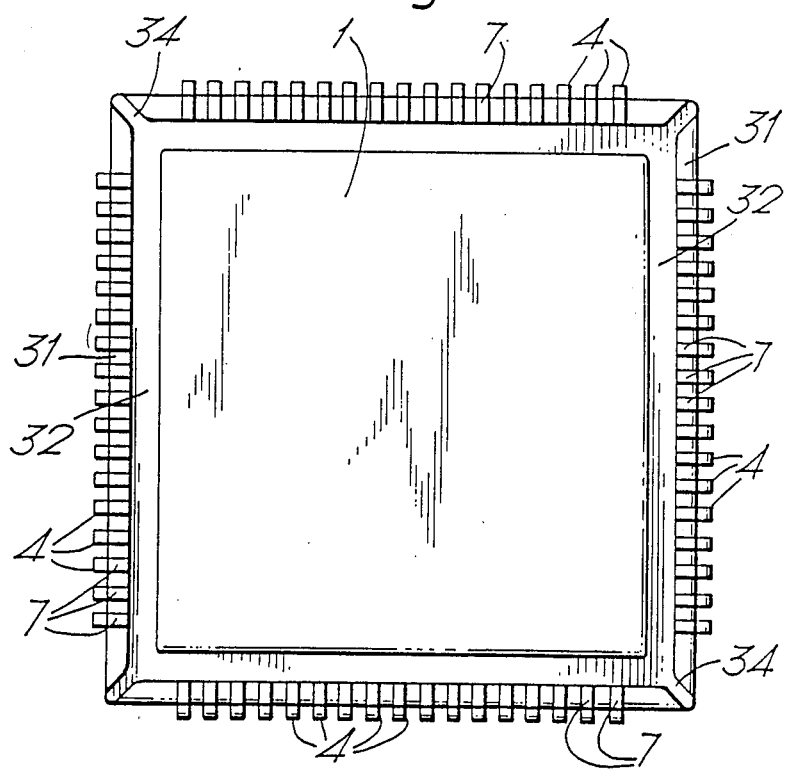

INTEGRATED CIRCUIT CHIP CARRIER

This invention relates to an integrated circuit chip carrier. More particularly it relates to a chip carrier made from a plastics material.

Known forms of chip carrier consist of a usually square base of ceramic material. A central area on the base is provided on to which an integrated circuit chip or die is mounted and secured, for example using a eutectic (gold/silicon) bond or an epoxy resin adhesive. Connections are then made between the appropriate points on the die to metal bonding pads provided on the carrier base. A preformed metallisation pattern on the carrier base connects the bonding pads to terminal contacts formed around the periphery of the base or to leads. A ceramic lid is then secured over the base so as to enclose and protect the die. The chip carrier is thereafter mounted on a printed circuit board together with a series of other chip carriers and electronic components that go to form the complete circuit.

These packages, though available in large quantities, do require that the chip is bonded to the carrier before the combination is encapsulated in the protective cover. As a consequence the chip manufacturer is usually involved in the package production. This is often convenient for those chips that are considered to be "large production runs". However, increasingly it would be convenient if there was a source of pre-manufactured packages, of the required shape, into which the chips could be introduced for protection.

Because the process by which a ceramic package is made precludes the introduction of the device until the package is complete, they were until recently the most readily available packages for this application. However, the use of ceramic material for the chip carrier is expensive and problems can also arise when the ceramic base is later bonded to a conventional epoxy-glass printed circuit board, due to the differential expansion between the two materials. In extreme environmental conditions the ceramic chip carrier can break away from the printed circuit board.

It is also known to make chip carriers of plastics materials, and with these it is possible to match the thermal coefficient of expansion (TCE) of the carrier to that of the circuit board. However, even with matched TCEs there may still be problems with differential expansion—the chip within the carrier is a source of heat which will tend to heat the carrier more rapidly than the circuit board, and hence even with identical TCEs the carrier can expand more rapidly than the circuit board.

Certain plastics chip carriers also suffer from the disadvantage that their wire bonding pads and their terminal pads are metallised in the same operation, with the result that the thickness of gold (which is the preferred final coat) is the same on both pad types. This causes problems where the terminal pads are to be soldered to, as the thickness of gold on the terminal pads must be kept below about 0.2 micrometers to prevent excessive enbrittlement of the solder. This requirement that terminal pads have gold less than 0.2 micrometers thick conflicts with the need for 2 micrometers thickness gold for optimum bonding of wires to the bonding pads. The additional complexity and expense involved in providing the optimum thickness of gold to each pad type makes such an approach unattractive, and in consequence poor wire bonding is accepted.

According to the present invention we provide a chip carrier comprising a body having a die attachment site, first contact pads for connection to a die and seconds contact pads for connection to a circuit board, in which the body is formed by injection moulding from an aromatic thermoplastic polymer.

According to another aspect of the present invention we provide a chip carrier comprising: a body having a die attachment site; first contact pads; a sidewall connected to the body; second contact pads on the sidewall remote from the body, and electrically connected to the first contact pads; in which the connection between the sidewall and the body is by means of a relatively thin, elastically deformable connecting region such that, in use, when the second contact pads are attached to a circuit board the elastically deformable region will accommodate thermally induced strains of the carrier relative to the circuit board.

According to another aspect of the present invention we provide a circuit board comprising a body having at least one recess with a die attachment site therein, metallised conductive tracks on the surface of the body and contact pads on the conductive tracks for connection to the die, or dies, in which the body if formed by injection moulding from an aromatic thermoplastic polymer.

Embodiments of the present invention will now be described by way of example with reference to the accompanying drawings in which:

FIG. 1c is a cross-sectional view of a chip carrier having an alternative form of construction;

FIG. 2a is a plan view of a 10×10 array of chip carriers prior to separation;

FIG. 2b shows details of the conductors of the array of FIG. 2a;

FIG. 3a shows a cross-sectional view of a chip carrier having an alternative form of construction;

FIG. 3b is a plan view from beneath of the chip carrier of FIG. 3a;

Figure 1A:
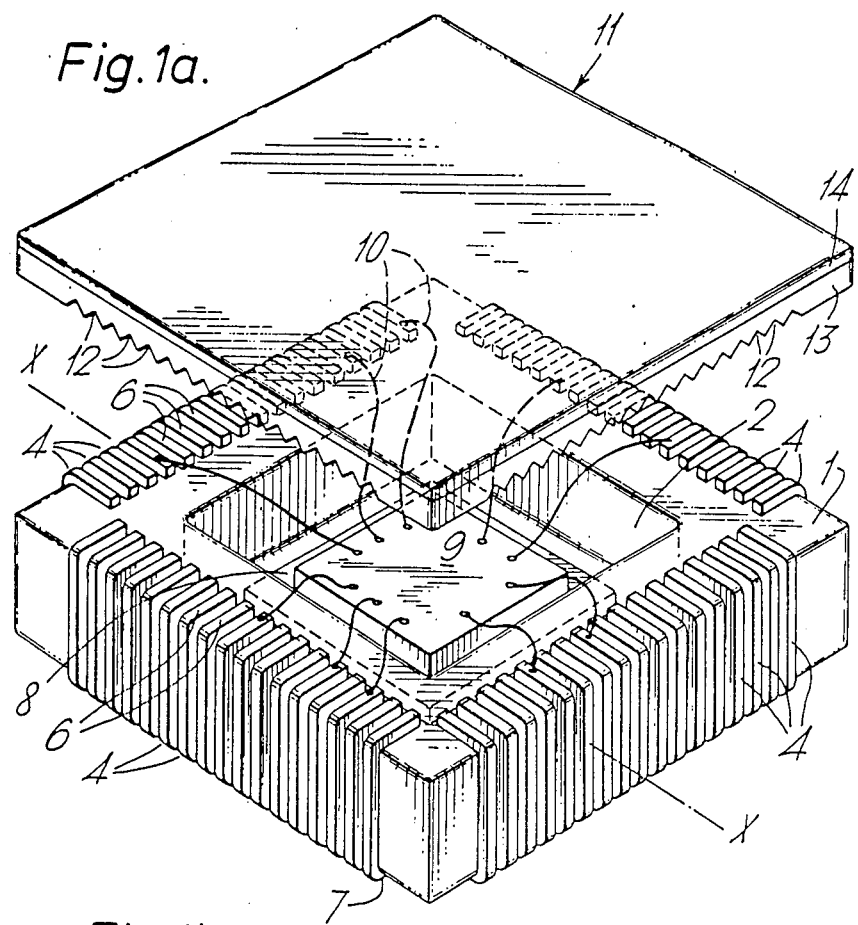
FIG. 1a is a perspective view of a chip carrier prior to bonding its lid to its body.

Referring now to FIG. 1a, a chip carrier 1 is moulded with a central die mounting cavity 2. About the edge of the chip carrier a plurality of metallised contacts 4 are provided. Each of the contacts comprises a metallisation which extends from the carrier's upper surface, down the side wall, and onto the carrier's lower surface. A part 6 of the contact on the carrier's upper surface is coated with gold to form a pad suitable for wire bonding. The corresponding contact part 7 on the lower surface is coated with a metal such as tin or an alloy such as tin/lead suitable for forming a solderable contact pad.

In the die mounting cavity a die bonding pad 8 is formed by metallisation. A die 9 is shown bonded (for example, with an epoxy resin) to the die bonding pad. Electrical contact is made to the various parts of the die by bonding aluminium or gold wires 10 to the die 9 and to the wire bonding pads 6.

A chip carrier as described above can be fabricated by injection moulding techniques. Suitable plastics for use in moulding such a chip carrier include aromatic polymers such as polyether ether ketone (PEEK) and polyethersulphone (PES) sold under the name VICTREX by ICI; polysulphone sold under the name UDEL by Union Carbide; and polyetherimide sold under the name ULTEM by General Electric. The structure of these polymers is as follows:

Polyether ether ketone $[-C_6H_4-CO-C_6H_4-O-C_6H_4-O-]n$

Polyethersulphone $[-C_6H_4-SO_2-C_6H_4-O-]n$

UDEL Polysulphone $[-C_6H_4-SO_2-C_6H_4-O-C_6H_4-C_3H_6-C_6H_4-O]n$

Figure 7:
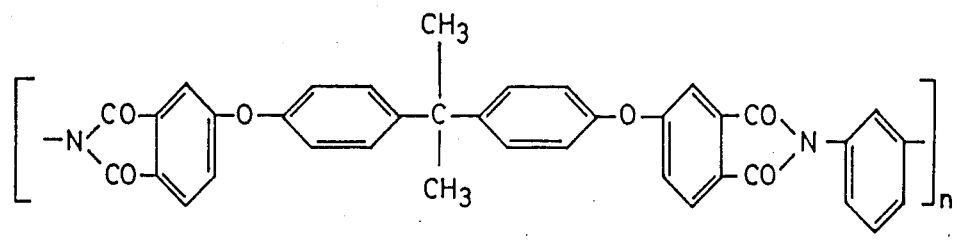
FIG. 7 shows the chemical formula of a polymer for use in forming the chip carrier.

Polyetherimide—see FIG. 7.

The principal factors which have to be taken into consideration when choosing a polymer for use in moulding chip carriers according to the present invention are:

(1) ability to withstand subsequent processing conditions, notably temperatures encountered during soldering—generally at least 215° C. in vapour phase tanks. This requires a glass transition temperature (Tg) of about 230° C. or more—although lower soldering temperature and/or shorter transit times may allow the use of polymers having lower glass transition temperatures.

(2) The polymer should be free of undesirable outgassing so that circuit reliability is not jeopardised.

(3) The polymer should be mouldable, preferably by injection moulding.

(4) The polymer should preferably be weldable (ultrasonically or otherwise) so that it is not necessary to use glues or adhesives (which can give rise to contamination problems in service).

(5) The polymer should accept metallisation, and preferably should be compatible with fully additive processing.

(6) The polymer should preferably accept pigments as some circuits are light activated and require opaque carriers.

(7) The polymer should preferably have a coefficient of expansion comparable to that of the circuit board material with which the carriers are to be used—typically this would be about 17 to $23 \times 10^{-6}$ $C.^{-1}$.

Referring again to FIG. 1a, in order to protect the die and the wire bonding from direct physical contact and contamination, a lid 11 is provided. The lid 11 is moulded from a material compatible with that of the body of the chip carrier to enable them to be joined without the use of glues, eg by ultrasonic welding. Because the contacts 4 are deposited on the surface of the chip carrier, they provide a stepped surface, and it is to this that the lid has to be sealed. For this reason the lid's lower surface is provided with indentations 12 in positions corresponding to the positions of contacts 4. In order to provide effective sealing, the indentations are made somewhat smaller than the contacts 4 which they are to receive, and in the example shown they are triangular, with the apex uppermost. During the welding of the lid to the base, pressure is applied to urge the lid towards the base, causing the lid to deform around the contacts to provide an effective seal to the contacts and the base. If desired an encapsulant (junction coating) can be applied to the wire bonded chip to provide additional mechanical and environmental protection during handling. The combined lid and body cavity serves to retain any such encapsulant. However, since encapsulant often flows too freely prior to the bonding of the lid to the body the lid may be made in two parts: the first part 13 comprises a sidewall, and the second part 14 a cap. The sidewall 13 is welded to the carrier body, encapsulant can then be applied to the wire bonded chip, and the cap 14 is then welded onto the sidewall 13.

It is possible to achieve a high degree of sealing with the chip carriers and they may be particularly suitable for use in high humidity environments.

Figure 1B:
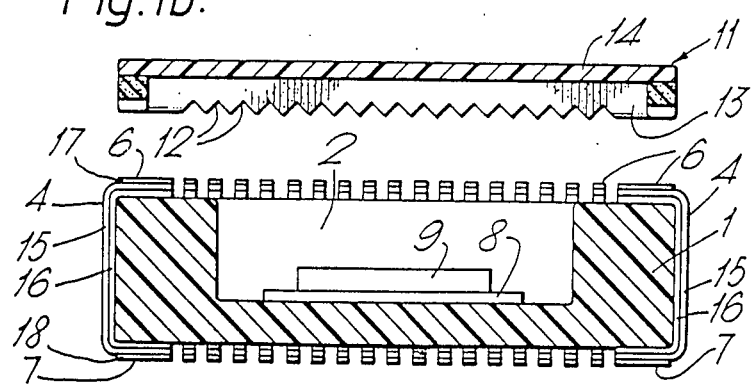
FIG. 1b is a cross sectional view of the carrier and lid of FIG. 1a taken on the line xx.

In FIG. 1b the construction of the chip carrier 1 and contacts 4 can more clearly be seen. The contacts 4 comprise multiple metallic coatings; a first coating 15 of copper, a 0.25 mm nickel coating 16 over the copper, a gold coating 17 over the nickel on the upper end of the contact to form the wire bonding pad 6, and a tin or tin/lead alloy coating 18 over the nickel of the lower end of the contact to form a solderable terminal pad 7.

In an alternative form of construction, the die bonding pad 8 can advantageously have a construction whereby differential thermal expansion between the chip carrier and the die 9 itself is better accommodated. (It will be appreciated that, whereas the carrier material has a typical TCE of $23 \times 10^{-6}$ $C.^{-1}$, that of silicon is about $2 \times 10^{-6}$ $C.^{-1}$.) This construction (see FIG. 1c) could be such that the die bonding pad 8 comprises a relief pattern 30 such as series of ribs, concentric rings, or a plurality of "pillars", or be "maze" shaped (the latter two constructions being even more advantageous than the first because they admit differential expansion in all directions in the relevant plane).

Figure 2B:
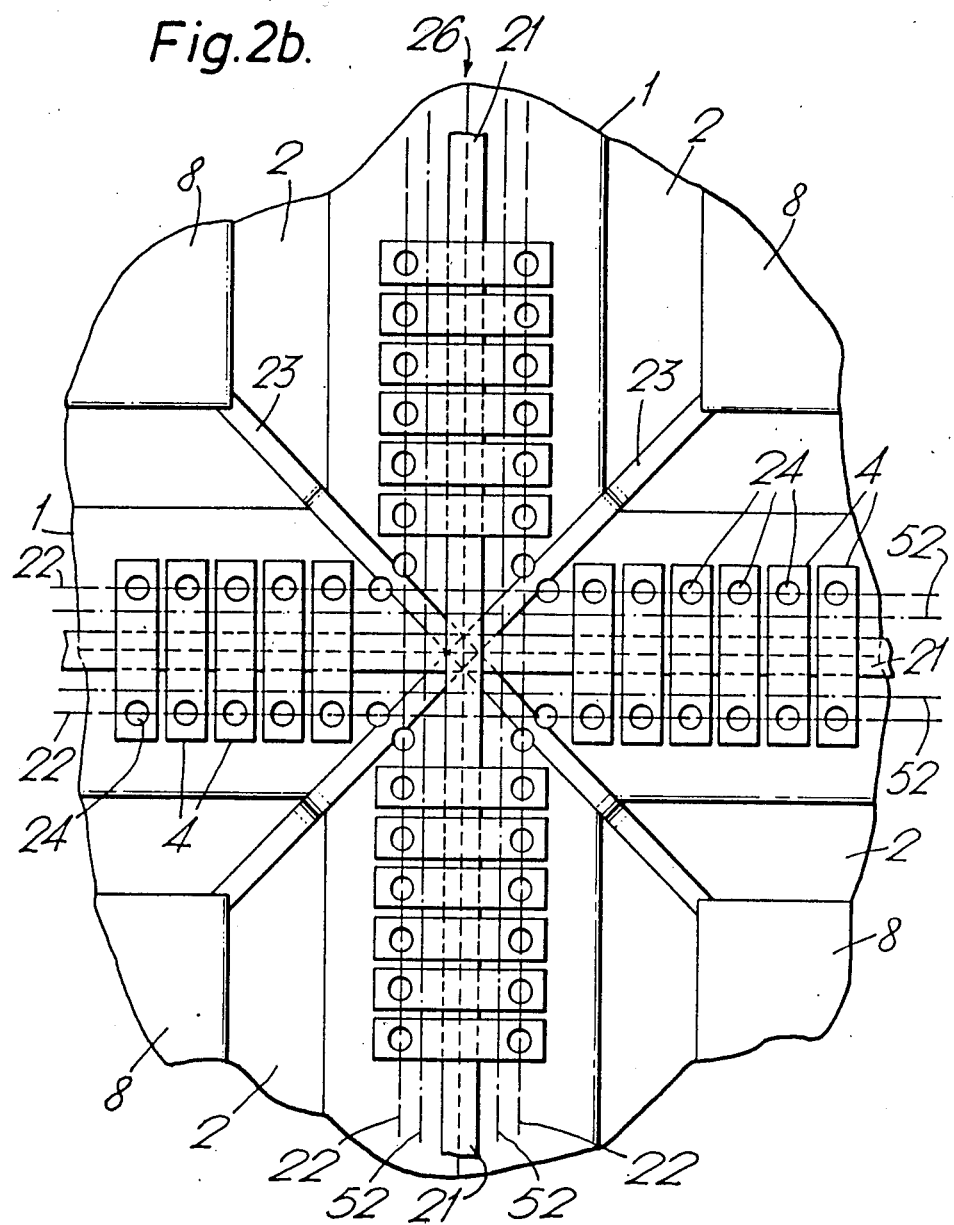

The chip carriers made by injection moulding in thermoplastic may conveniently be moulded in a matrix of for example $10 \times 10$. Such a matrix is shown in FIG. 2a, and details of the arrangement of conductors etc between adjacent carriers is shown in FIG. 2b. The matrix is moulded as a generally flat sheet containing the die cavities and the necessary holes for producing conductors 4. Note that chip carriers may be moulded without cavities, deeper lids being provided to supply the die mounting cavity. Preferably, however, the carrier body will have a moulded-in die mounting cavity, as this offers a number of advantages, including some protection against accidental damage during processing.

The described embodiments of the invention contemplate two alternative methods of producing the conductors 4 and die bonding pads 8. In the first "subtractive" method, a copper coating is formed by lamination or electroless deposition and etched using conventional resist techniques: desired coatings of nickel, gold, tin, etc can then be selectively plated. In the second "additive" method, all metallisation is initially carried out by electroless deposition and etching is unnecessary. The pattern, once defined, can be built up either electrolessly or by electroplating. Both methods have the advantage, as compared with processes where the final finish is used as a mask for etching the copper beneath, of avoiding the deposition of gold in areas where it is undesirable (for the reasons discussed earlier). This approach is made practicable by injection moulding whereby holes can be formed, easily at the moulding stage, avoiding a prohibitive amount of drilling being required to produce the necessary through-hole connections.

In the "additive" method, the conductors 4 and die bonding pads 8 are produced after the matrix is moulded, and, for this reason, it is not necessary to provide any metallic inserts during moulding. Processing may be facilitated by producing plating bars 21 in rows or as a grid between the individual chip carriers. In this way it is possible, if desired, to connect together all the chip carriers to form a single electrode.

The first stage in defining the conductor pattern involves rendering the surface of the plastic sufficiently sensitive to accept an electroless copper deposition. This may be done in any convenient way, although the preferred method is to use the resistless imaging process devised by PCK Technology of Melville, N.Y. and known as Photoforming. In this process the moulding is chemically etched to render this surface hydrophilic to enable deposition of a catalyst and electroless copper. After etching, the surface is activated with a solution containing an ultra violet (UV) photo initiator and copper salts. On exposure to UV light the copper ions present in the solution are reduced to metallic copper. It is therefore possible to produce the desired metallisation pattern in copper simply by exposing their requisite areas to UV light. Following this initial copper deposition, electroless copper deposition can be used to produce a thicker copper layer which can be used as an electrode in subsequent electroplating steps. It should be noted that for use in such processes the polymers discussed require treatment, such as doping with titanium dioxide to render them opqaue to ultra-violet light.

Of course, other techniques, involving plating masks or resists can be used, but these will generally require many more process steps and are likely to increase production costs.

If plating bars (ie broad tracks) such as those shown at 21 in FIG. 2b are used, it may be possible to dispense with the electroless copper plating step, and simply electroplate on the pattern defined in the photoforming step.

Following deposition of copper either electrolessly or electrolytically, a nickel coating is electro plated over the copper.

As can be seen in FIGS. 2a and 2b, all those parts of the chip carrier which are to be metallised, ie the contacts and the die bonding pads 8, can all be interconnected (the die bonding pads may be formed by insertion of a metallic stud or in some other way which does not require the pads to be plated, in which case they need not form part of the electrode). The tracks 21 serve to interconnect these regions on all the carriers and are removed when the matrix is separated to form individual carriers. This is most easily done by arranging the tracks 21 in the form of a lattice with one chip carrier per cell. As can be seen, there are no contacts 4 at the corners of the chip carriers (as this could result in different path lengths between the die and the different terminal pads 7), and these spaces allow tracks 23 to be run from the die bonding pads to the tracks 21 of the lattice. Alternatively tracks could be run directly from a contact 4 at the centre of one side of the carrier to the die bonding pad. These could be cut at a later stage or (if external connection to the semiconductor substrate is required) allowed to remain.

At the site of each contact 4 a hole or slot 24 is provided through the board. At each end of these holes or slots a metallised pad, (which on the upper surface of the chip carrier will form wire bonding pads 6 or on the lower side of the chip carrier will form the terminal pads 7) is provided. The photoforming step provides sufficient metallic copper on the walls of the holes 24 for subsequent metallisation to give fully plated through holes.

Following the nickel plating step the wire bonding pads are plated with 2 micrometers of gold. By using taped resists (ie resists or masks in the form of adhesive tapes) it is possible to quickly and easily mask both ends of the holes 4 and those surfaces of the carrier (including the underside) which are not to be plated with gold. It is thus possible to selectively plate with gold, so that none is applied to the terminal pads thereby avoiding subsequent embrittlement of the solder used to attach the chip carrier to a circuit board. As previously mentioned, the terminal pads may be pre-coated with a tin or lead alloy.

After completing the metallisation steps, the matrix of chip carriers can be divided into individual carriers either before or after dies are bonded and wired to the carriers, although usually the chip carriers will be separated before dies are bonded to them.

The matrix of chip carriers can have lines of weakness moulded into it, along the edges of the plating bars for example, so that it is possible (depending upon the material used) to snap off lines of carriers or individual carriers. If the precursors of the contacts 4 are slots or a combination of slots and holes, it may be possible to use them so the line of weakness along which the chip carriers may be separated by 'snapping' apart. Alternatively, the matrix may be divided up using a saw, for example a circular saw. In either case the conductive tracks which have been used during electroplating are removed during separation of adjacent carriers. Where each of the boundaries of each chip carrier is defined by a separate row of holes, as in FIG. 2b so that between any two adjacent carriers there are two rows of holes, the material removed during separation (for a leaded carrier) comprises that between the two rows of holes—viz by severing along lines 22 leaving each separated chip carrier with edges comprising flat portions between concave conductors 4. Where a single row of holes is used to produce the conductors 4 of two adjacent carriers separation must be carried out carefully to ensure that no conductors 4 are lost from any carrier during separation. Alternatively, for a leadless carrier, separation is along lines 52 leaving the holes 24 into which leads can be inserted.

If a totally electroless metallisation process is used, on the other hand, the plating bars become unnecessary, and in that case the carriers could be moulded as individual items joined only by fine webs at (for example) the corners.

Figure 2C:
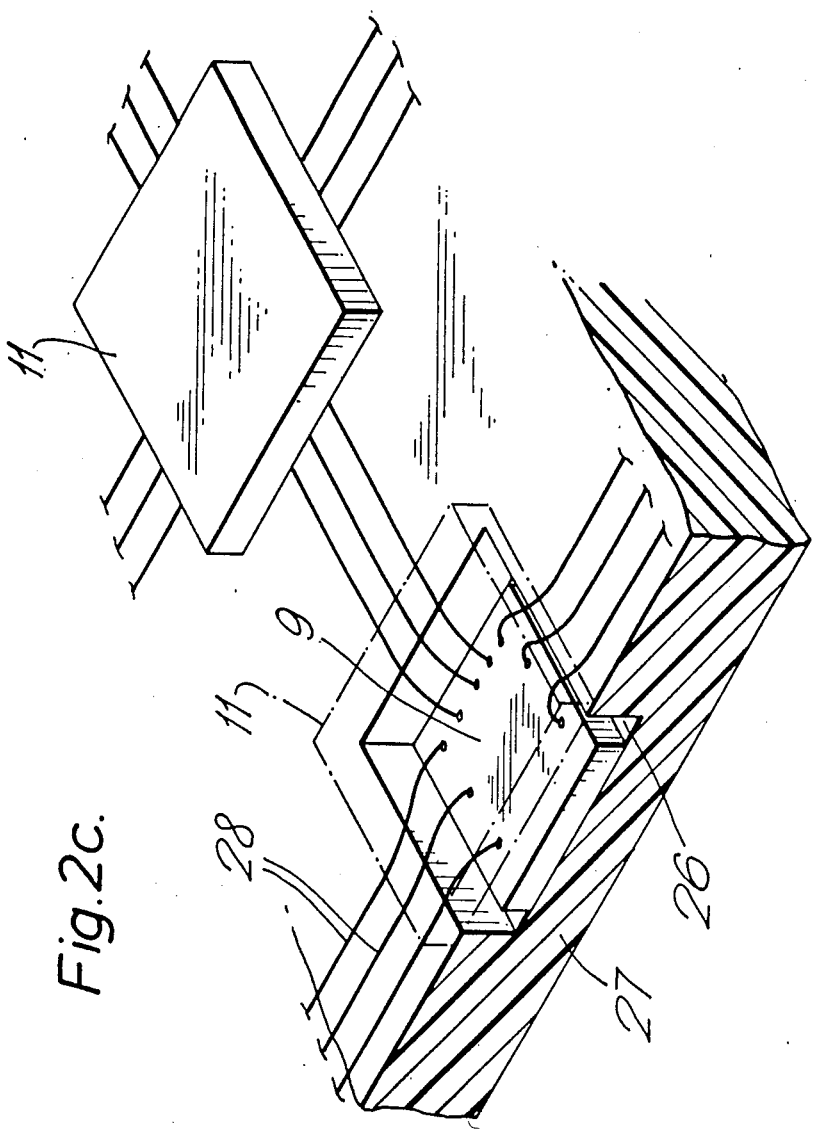
FIG. 2c shows a multiple chip carrier according to the present invention.

A further advantage of making chip carriers by injection moulding is that the material used can have a coefficient of thermal expansion similar to that of most of the metal cored printed circuit boards (PCB) and substrates. As a result whole PCBs could be moulded having recesses at the chip sites like a multiple-chip carrier—and metallized as previously described. The chip would then be bonded into the cavities and protected with junction coatings. Then lids of the same nature as those proposed for the single-chip carrier could be welded into place to afford mechanical protection. The added benefit of this solution is that the tracking on the PCB could be taken directly into the chip housing and thus the problems of the package/board interface are removed. FIG. 2c is a perspective view of part of such a construction in which a chip 9 is accommodated in a rectangular recess 26 in an injection moulded substrate 27, a lid 11 is shown covering another recess. Another advantage of this arrangement is that the absence of a separate carrier between the chip and a PCB, coupled with the location of the chip in a recess means that the upper, connecting, surface of the chip can be arranged to be co-planar with conductive tracks 28 on the substrate, providing superior transmission—line properties for highspeed/high frequency operation.

The problems of thermal strain in chip carriers produced by injection moulding or otherwise can be combatted by a variety of techniques; in addition to the provision of a relief profile in the die bonding pad, which is particularly advantageously produced by injection moulding techniques. Referring now to FIG. 3; FIG. 3a shows a chip carrier in which the side walls 31, which are metallised to form the contacts 4, are each separated from the main chip carrier body by a slot 32, which extends to virtually the full height of the side wall; this side wall being connected to the main body by only a thin elastically deformable portion 33. The provision of these deformable portions enables the chip carrier to repeatedly accommodate relatively large strains resulting from differential thermal expansion without imposing large stresses on the solder joints between the terminal pads and the circuit board.

Figure 3C:
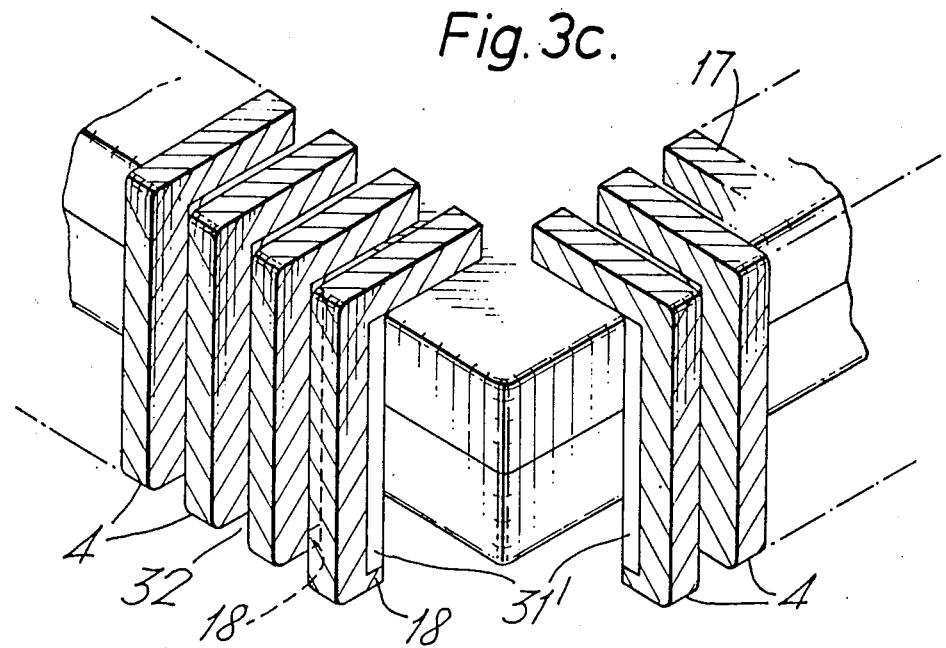
FIG. 3c is a perspective view of a chip carrier having sidewall segments for each of the contacts.

In FIG. 3b it can be seen that at each corner of the chip carrier there is a gap 34 between the adjacent side walls. This gap allows the carrier to accommodate strain along its length and across its width. Where the amount of strain is expected to vary along the side wall, which may occur when the chip carrier is very large, it may be desirable to provide gaps in the side walls. There may be occasions when it is desirable to divide the side walls further, even to the point of having one side wall segment for each of the contacts 4. This is shown in FIG. 3c, where the metallised parts 4 of the contacts are shown hatched; the underlying plastics part 31', which is integrally moulded with the rest of the carrier body, remains unshaded. It should be understood that the metallisation is formed over the divided sidewall, and that FIG. 3c does not show separately added legs.

Figure 4:
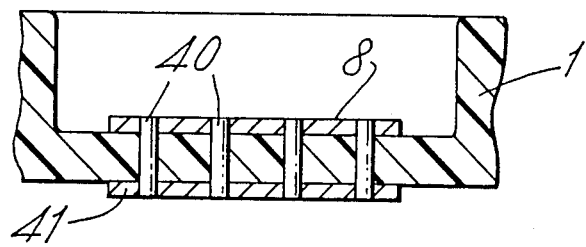
FIG. 4 is a cross-sectional view through a chip carrier having plated through holes to provide improved heat shedding capacity.
Figure 5:
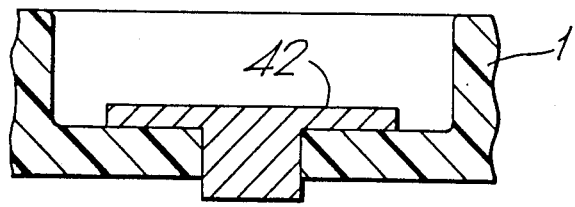
FIG. 5 is a cross-sectional view through a chip carrier having an inserted combination die bond pad and thermal pillars.

Alternatively for use with highly heat dissipative chips a thermal path maybe incorporated in the die bond pad, and various arrangements are shown in FIGS. 4 and 5.

The chip carrier shown in FIG. 4 has several plated through holes 40 in the die bonding pad 8. These holes are produced at the same time and in the same way as the interconnection holes used to form the contacts 4. Alternatively, the holes can be left unplated and slugs of a thermally conductive material (eg copper) inserted. In either case, a thermal pad 41 on the underside of the chip carrier, corresponding to the die bond pad 8, would enhance heat transfer. For efficient heat transfer the thermal pad may be soldered to a corresponding contact on the circuit board to which the chip carrier is to be attached. Indeed, this form of attachment could be used as a means of mechanical anchorage even in the absence of thermally conductive material extending through the carrier. This solder connection can be replaced with a high heat conductivity grease to bridge any gap between the thermal pad and the circuit board. Alternatively the thermal pad may not be connected to the circuit board but left to radiate heat, as for instance, when included in an injection moulded multiple chip carrier.

Greater thermal transport may be provided by means of a legged platform or stud 42 (FIG. 5) which can either be incorporated into the matrix during injection moulding, or inserted into a suitable hole formed during moulding. Alternatively, this stud may consist of two parts, an upper and a lower, which can be inserted or moulded in separately.

Where the thermal pad is to be soldered to the substrate it is preferable that the surface which is to be soldered comprises a number of discrete areas so that the formation of voids is minimised.

In addition to the improvement in heat transfer provided by soldering the thermal pad to the circuit board, there is a further advantage in that the gauge length over which the thermal stress acts is considerably reduced. Without the central attachment provided by the thermal pad the gauge length would be the distance between the side walls. With a thermal pad this is reduced to just twice the distance between the thermal pad and the side wall, ie the gauge length is reduced by the width of the thermal pad.

The problems of soldering the thermal pad 41 or an anchorage pad to a circuit board increase as the size of the chip (and carrier) increases. Reflow soldering is carried out by pre-coating the pad and contact pads with a solder paste comprising powdered solder, powdered flux and an organic binder. The application of heat (as uniformly as possible) by any of a number of known techniques, eg vapour phase soldering, causes flow of the solder and flux and a solder joint is formed.

Figure 6:
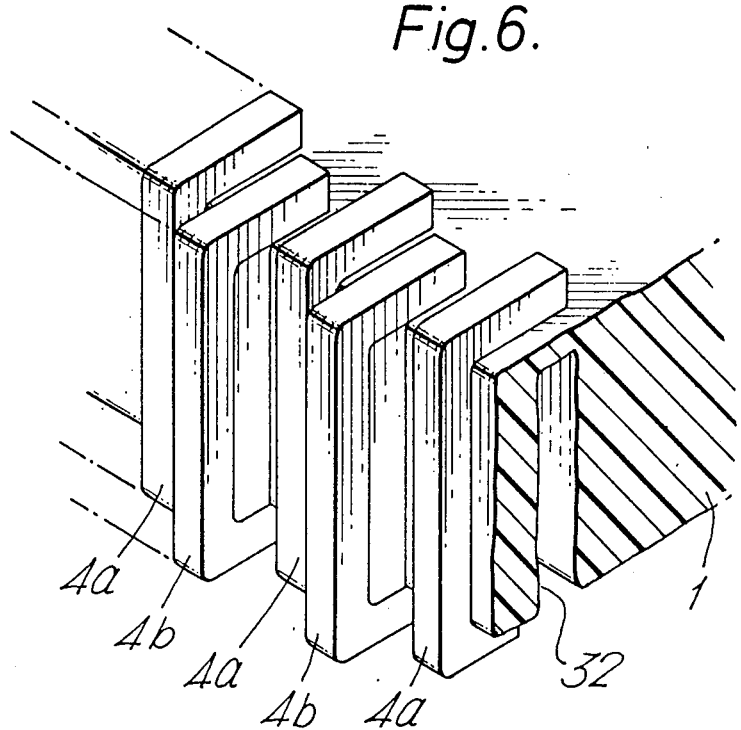
FIG. 6 is a perspective view of a chip carrier having staggered contacts.

The proposed construction further allows the use of a small circuit board track width and separation which may enable greater circuit densities to be realised. This can be achieved by offsetting adjacent terminal contacts on the carrier, for example by providing an inner and an outer row of terminal contacts as shown in FIGS. 6. It can be seen that the edge of the chip carrier is castellated, with an inner and an outer row of contacts 4a, 4b; the size and offset being such that the inner terminal contacts can be inspected by looking through the gaps between adjacent outer terminal contacts. In this way, it is possible for all the contacts between a chip carrier and a circuit board to be visually inspected. The provision of an inner and an outer row of terminal contacts allows the pitch of the contacts to be reduced, and hence allows denser packing, while maintaining adjacent solder pad separation.

The chip carriers may also be made compatible with circuit boards using plated through hole (pth) technology by providing them with leads. Such chip carriers are made as has been described above (although there is no need to provide terminal contacts on the carrier's lower surface), with each chip carrier having its own array of holes 24 which are to be used to provide contacts 4. The leads are inserted into the holes 24, either singly or in a ganged operation into several holes simultaneously using for example an automatic leading machine. The leads should be suitably sized to provide an efficient seal to the holes through which they pass.

After insertion the connecting pieces between ganged leads can be removed, and the leads left straight for through board insertion or 'joggled' to form a surface mounting footprint.

I claim:

1. A leadless chip carrier comprising:

a body having a die attachment site and a body outer wall portion;

first contact pads;

a peripheral sidewall portion radially outward of said body outer wall portion and having a peripheral inner wall portion and a peripheral outer wall portion, said peripheral sidewall portion laterally spaced from said body outer wall portion and having on an underside second contact pads for attaching, in use, the chip carrier to a circuit board, said peripheral sidewall portion having a predetermined height, the second contact pads being electrically connected to the first contact pads;

a link region, disposed near an upper carrier surface remote from said underside, connecting the peripheral sidewall portion to said body, the link region, the peripheral sidewall portion and said body defining a slot disposed generally about a periphery of said body, the link region having a thickness substantially less than said predetermined height and being an elastically deformable region such that, in use, thermally induced strains of the carrier relative to the circuit board are accommodated by the link region.

2. A chip carrier as claimed in claim 1 in which the sidewall is divided between adjacent second contact pads.

3. A chip carrier as claimed in claim 2 in which adjacent second contact pads are offset.

4. A chip carrier as claimed in claim 1, 2 or 3 in which the body is formed by injection moulding from an aromatic thermoplastic polymer.

5. A chip carrier as claimed in claim 4, in which the aromatic thermoplastic polymer is polyether ether ketone or polyethersulphone or polysulphone or polyetherimide.

6. A chip carrier as claimed in claim 4 in which the die attachment site comprises a relief pattern.

7. A chip carrier as claimed in claim 4 in which the chip carrier is produced in a matrix of injection moulded carriers and separated after moulding.

8. A chip carrier as claimed in any one of claims 1, 2, or 3 in which the die attachment site is recessed into the body of the chip carrier.

9. A chip carrier as claimed in claim 8 having a die mounted on the die attachment site in which the connecting surface of the die is co-planar with the first contact pads.

10. A chip carrier as claimed in any one of claims 1, 2, or 3 including a metallised attachment pad on its underside whereby the carrier may be mounted on the circuit board with the attachment pad and the contact pads soldered to corresponding areas on the circuit board.

11. A chip carrier as claimed in claim 10 in which the die attachment site comprises a region having a higher thermal conductivity than the body and including thermally conductive means extending through the body between the die attachment site and the attachment pad.

12. A leadless chip carrier for protectively housing an integrated circuit chip and for electrically connecting the chip to external circuts on a circuit board, said chip carrier comprising:

a body having an upper and lower surface and including a die attachment site;

first contact pads;

a slot formed in the lower surface of said body and extending through substantially the full thickness thereof, said slot disposed generally about a periphery of the body to define a laterally spaced sidewall connected to the body by a relatively thin connecting region;

second contact pads disposed on said lower surface radially outwardly of the slot;

electrical connections disposed on said connecting region and said sidewall of the carrier for connecting the first and second contact pads; wherein the relatively thin connecting region between said sidewall and said body is elastically deformable so that, in use, thermally induced strains of the chip carrier relative to the circuit board are accommodated by the connecting region.

13. A leadless chip carrier as defined in claim 12 wherein the sidewall of the carrier is castelated about its peripheral edge so that adjacent second contact pads are radially offset with respect to each other.

14. A leadless chip carrier as defined in claim 12 wherein the sidewall of the carrier is divided into discrete segments, each of said second contacts being disposed on one of said segments.

15. A leadless chip carrier as defined in claim 12 in which the body is formed by injection molding from an aromatic thermoplastic polymer.

16. A leadless chip carrier as defined in claim 15 in which the aromatic thermoplastic polymer is polyether ketone or polyether sulphone or polysulphone or polyetherimide.

17. A leadless chip carrier as defined in claim 12 in which the chip carrier is produced in a matrix of injection molded carriers and separated after molding.

18. A leadless chip carrier as defined in claim 12 in which the die attachment site is recessed into the body of the chip carrier.

19. A leadless chip carrier as defined in claim 18 and further including a die mounted on the die attachment site, the die having an upper connecting surface which is co-planar with the first contact pads.

20. A leadless chip carrier as defined in claim 18 in which the die attachment site comprises a region having a higher thermal conductivity than the body and including thermally conductive means extending through the body between the die attachment site and the attachment pad.

21. A leadless chip carrier as defined in claim 12 wherein the carrier is provided with a metallized attachment pad on its under side so that the carrier may be mounted on a circuit board with the attachment pad and the second contact pads soldered to corresponding areas on the circuit board.

22. A leadless chip carrier comprising:

a one-piece structure having a central recess for receiving and protectively mounting an integrated circuit die;

said structure having at least one interior wall portion and including at least one pair of spaced-apart sidewalls disposed at an edge of said structure, said spaced-apart sidewalls having a predetermined height and having an outer peripheral wall portion and an inner peripheral wall portion, said inner peripheral wall portion being laterally spaced apart from said interior wall portion of said structure, an integral thin elastically deformable link portion having a thickness substantially less than said predetermined height, said link portion interconnecting said spaced-apart sidewalls and said interior wall portion of the one piece structure, said link portion being disposed near a first upper carrier surface; said link portion, said spaced-apart sidewalls and said interior wall portion defining a slot;

plural first conductive pads disposed for electrical connection to an integrated circuit ship mounted in said recess; and a plurality of second conductive pads disposed on an outermost sidewall and electrically connected along an outside of the outermost sidewall to respective ones of said first pads, said seconds pads being disposed near a second lower carrier surface remote from said link and being disposed for electrical connection to external circuits via said outermost sidewall and its associated link portion so as to reduce thermally induced stresses between the chip carrier and such connected external circuits.

23. A leadless chip carrier as in claim 22 further including a lid element adapted to sealingly enclose said recess.

24. A leadless chip carrier as in claim 22 wherein said pair of spaced-apart outer sidewalls extend about substantially the entire perimeter of said structure.

25. A leadless chip carrier as in claim 22 wherein said pair of spaced-apart outer sidewalls include plural substantially straight segments juxtaposed at angulated corners and wherein the outer most wall includes a through-slot formed therethrough at such corners.

26. A leadless chip carrier as in claim 22 wherein the outermost sidewall of the carrier is castelated about its peripheral edge so that adjacent second contact pads are radially offset with respect to each other.

27. A leadless chip carrier as in claim 22 wherein the outermost sidewall of the carrier is divided into discrete segments, each of said second contacts being disposed on one of said segments.

28. A leadless chip carrier as in claim 22 wherein the structure is formed by injection molding from an aromatic thermoplastic polymer.

29. A leadless chip carrier as in claim 22 further including a die mounted on the die attachment site, the die having an upper connecting surface which is co-planar with the first contact pads.

30. A leadless chip carrier as defined in claim 22 wherein the carrier is provided with a metallized attachment pad on its underside so that the carrier may be mounted on a circuit board with the attachment pad and the second contact pads soldered to corresponding areas on the circuit board.

31. A leadless chip carrier as in claim 22 wherein the die attachment site comprises a region having a higher thermal conductivity than the body and including thermally conductive means extending through the body between the die attachment site and the attachment pad.

* * * * *